United States Patent [19]

Florin et al.

[11] Patent Number: 4,730,558
[45] Date of Patent: Mar. 15, 1988

[54] ELECTRONIC DELAYED-ACTION EXPLOSIVE DETONATOR

[75] Inventors: Johann Florin, Troisdorf; Friedrich Heinemeyer, Siegburg; Peter Röh; Ulrich Steiner, both of Troisdorf; Edward Uden, Barmstedt, all of Fed. Rep. of Germany

[73] Assignee: Dynamit Nobel Aktiengesellschaft, Fed. Rep. of Germany

[21] Appl. No.: 793,764

[22] Filed: Nov. 1, 1985

[30] Foreign Application Priority Data

Nov. 2, 1984 [DE] Fed. Rep. of Germany ....... 3440016

[51] Int. Cl.⁴ ............................................. F42C 11/06
[52] U.S. Cl. .................... 102/218; 102/215; 102/202.7
[58] Field of Search ............... 102/206, 215, 218, 219, 102/220, 202.7

[56] References Cited

U.S. PATENT DOCUMENTS

| | | | |
|---|---|---|---|
| 2,943,569 | 7/1960 | Wolfe | 102/206 |
| 3,181,464 | 5/1965 | Parker et al. | 102/202.7 |
| 4,015,531 | 4/1977 | Ziemba | 102/215 |
| 4,311,096 | 1/1982 | Oswald | 102/220 |
| 4,445,435 | 5/1984 | Oswald | 102/215 |
| 4,586,437 | 5/1986 | Miki et al. | 102/218 |

Primary Examiner—Stephen C. Bentley
Assistant Examiner—Stephen M. Johnson
Attorney, Agent, or Firm—Antonelli, Terry & Wands

[57] ABSTRACT

An electronic delayed-action explosive detonator comprising a tubular case, a capacitor chargeable by pulses from a blasting machine, an integrated circuit for processing pulses from the blasting machine to set a delay time, the integrated circuit controlling the elapse of the delay time after the delay time has been set, a primer to which current is supplied upon elapse of the delay time for enabling detonation, and detonator wires extending from the tubular case for enabling connection of the blasting machine to at least one of the capacitor and integrated circuit. A supporting plate arrangement for carrying the integrated circuit is disposed in series with the capacitor within the tubular case. The supporting plate has a first contact area with connecting pads for enabling attachment of leads of the capacitor, and a second contact area with connecting pads for enabling attachment of the detonator wires which are within the tubular case and extend outwardly therefrom.

26 Claims, 6 Drawing Figures

ELECTRONIC DELAYED-ACTION EXPLOSIVE DETONATOR

The present invention relates to an electronic delayed-action explosive detonating device with a capacitor that can be charged by pulses from a blasting machine, with an integrated circuit processing the pulses from the blasting machine for setting a delay time, this circuit controlling the course of the delay time after the setting step. The explosive detonating device is provided with a fusehead to which current is supplied upon elapse of the delay time, and with detonator wires to connect the blasting machine to the integrated circuit.

It is known to employ, in place of a pyrotechnical delay charge usually utilized in delayed-action explosive detonators, an electronic circuit that takes over the delay function. Electronic time delay is considerably more accurate and less subject to individual variations than the pyrotechnical delay. In order to detonate explosive blasting charges in chronologically staggered sequence for increasing the blasting effect, it is necessary to equip the blasting charges with delayed-action blasting detonators effecting differing delay periods. For this purpose, the delayed-action explosive blasting detonators with pyrotechnical delay as well as those with electronic delay are provided as early as during their manufacture with the desired delay so that the intended delay time and/or an intended delay interval are produced. However, this requires a large number of different delayed-action explosive detonators which are distinguished from one another by their delay times. The large variety of types requires great costs in manufacturing and warehousing.

The conventional electronic delayed-action explosive detonators differ from the pyrotechnical delayed-action explosive detonators in that they exhibit a larger volume and require a large amount of space, and that their manufacture is complicated and expensive.

It is therefore an object of the present invention to provide an electronic delayed-action explosive detonator of the type discussed hereinabove which, in spite of a high packaging density of its components, enables a simple connecting technique, is mechanically resistant against stress, shock or the like and displays high operational safety.

This object has been attained according to the present invention by providing an electronic delayed-action explosive detonator wherein a supporting plate carrying an integrated circuit and exhibiting electric conductors, and a capacitor are accommodated in series arrangement in a tubular case; that the supporting plate exhibits a first contact area with connecting pads to attach the leads or legs of the capacitor; and a second contact area with connecting pads for attaching the detonator wires extended out of the case is provided at the supporting plate or at an additional plate section.

In the delayed-action explosive detonator according to this invention, all of the circuit components except for the capacitor are accommodated in a chip mounted to the supporting plate. The supporting plate as well as the capacitor are housed in the tubular case which can have the same shape and the same dimensions as the cases of pyrotechnical delayed-action explosive detonators. The supporting plate to which the integrated circuit is attached contains conductors to which the terminals for the integrated circuit are bonded. Subsequently, the legs of the capacitor are soldered to this supporting plate, the capacitor and the supporting plate being oriented along an axis common to both of them. Thus, the capacitor is attached at one end of the supporting plate. The soldering connection effects electrical connection as well as mechanical attachment between the supporting plate and the capacitor. The supporting plate, together with the capacitor, forms a narrow, elongated module extensively adapted to the shape of the narrow case. A compact, narrow structure is thus created. The capacitor is soldered with its legs, which latter can have a short minor length, to conductors on the supporting plate. The capacitor is arranged in a prone, rather than upright, position with respect to the supporting plate, the legs extending in parallel to the latter. Thereby, relatively long soldered connections can be established, resulting in a high strength of the soldered bond and high safety with respect to shocks and vibrations.

According to a preferred further development of the invention, the provision is made that a plate section carrying the second contact are is joined with the supporting plate by way of at least one path extending laterally along the capacitor. The path can exhibit at least one conductor, one end of which leads to a connecting pad of the second contact area and the other end of which is connected by bonding to the integrated circuit. In this embodiment, a single, plate-shaped circuit substrate is provided, consisting of the supporting plate and the plate section and containing both contact areas. The path bridges the length of the capacitor and should be as narrow as possible.

In an alternative version of the invention, the plate section carrying the second contact area is located separately from the supporting plate, and the connecting pads of the second contact area are connected to the integrated circuit via wires extending laterally along the capacitor. In this version, the length of the capacitor is bridged by thin wires so that the diameter of the capacitor can be made almost as large as the internal diameter of the case.

According to a preferred embodiment of the invention, a programming area of conductors is formed on the printed circuit board; this programming area being alterable by external intervention for the setting of selectable delay periods. Such a programming area makes it possible to utilize the same circuit for numerous delay times, and to set the desired delay time, by affecting the programming area, only shortly before the assembly of the delayed-action explosive detonator. The programming area can consist, for example, of a matrix arrangement of conductors which can be connected by bridges or separated in order to produce varying electrical bit patterns determining the delay time. Delayed-action explosive detonators having varying delay times differ merely by their correspondingly modified programming areas. There is no need for tampering with the interior of the integrated circuit.

Preferably, the conductors of the programming area are connected to the integrated circuit in such a way that the delay time can be altered by interruption of one of these conductors or a combination of these conductors. The conductors herein are first mounted on the supporting plate in the intact condition, and they can be severed by mechanical intervention or, for example, by means of laser beam cutting.

The invention furthermore offers the possibility of eliminating the customarily employed, separately prefabricated fusehead, by producing a fusehead at the supporting plate. For this purpose, a bridgewire is directly connected to terminals of the supporting plate or a metallic film bridge is deposited between two terminals of the supporting plate.

These and further objects, features and advantages of the present invention will become more obvious from the following description when taken in connection with the accompanying drawings wherein.

Figure 1:
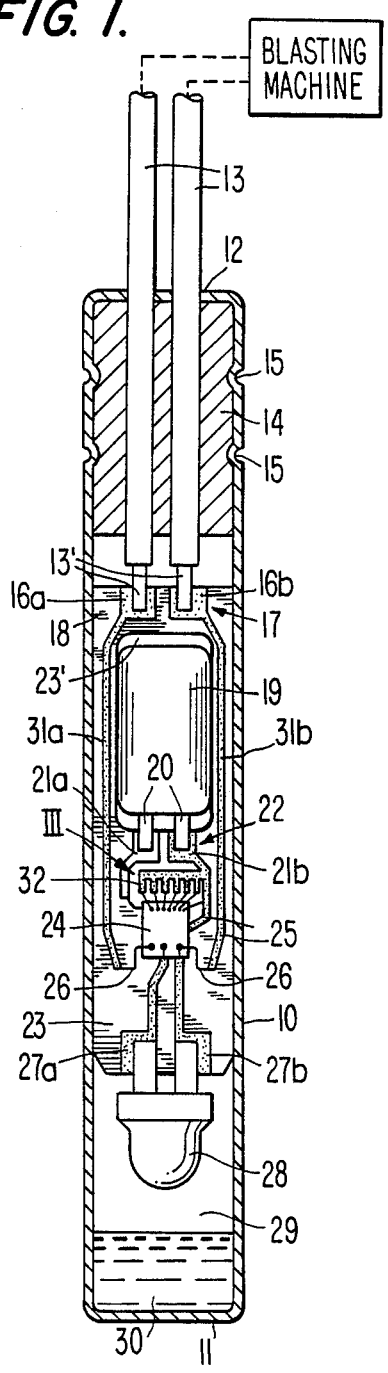
FIG. 1 shows a longitudinal sectional view of an electronic delayed-action explosive detonator.
Figure 2:
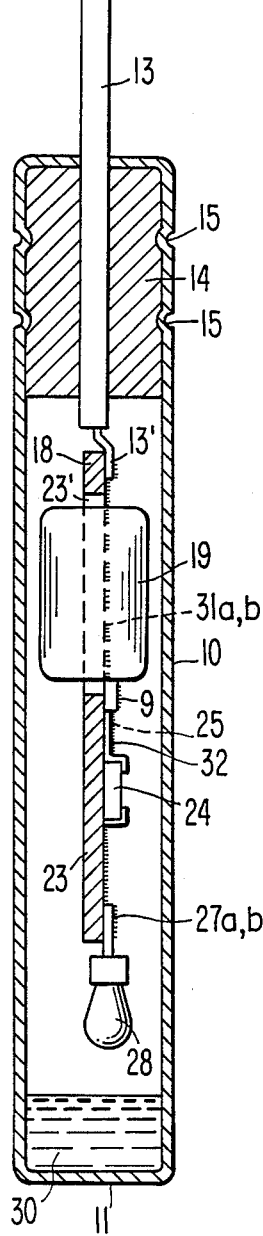
FIG. 2 is a sectional view of the electronic delayed-action explosive detonator at right angles to the sectional view of FIG. 1.
Figure 3:
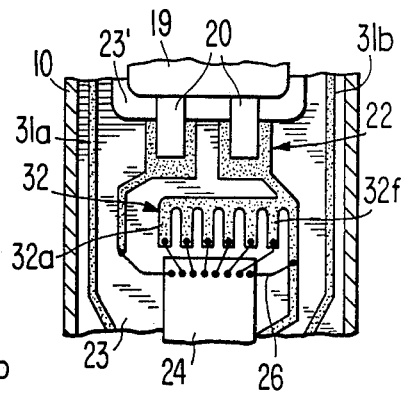
FIG. 3 shows an illustration of detail III from FIG. 1 on an elongated scale.

Referring now to the drawings wherein like parts are provided with like reference numerals throughout the several views, the delayed-action explosive detonator of the present invention, as illustrated in FIGS. 1–3, exhibits an elongated housing in the form of a cylindrical, tubular case consisting of a metal, e.g., copper. The case 10 is closed at its forward end 11 and at its rear end has an opening 12 through which two detonator wires 13 extend from the outside into the interior of the case. The detonator wires 13 are enclosed along part of their length by a plug 14 of a synthetic resin, which latter is fixed at the rearward end of the case 10 by crimps 15 of the case jacket. The detonator wires 13 are each equipped with an insulating sheath, and only their front ends 13' are bare. The ends 13', projecting out of the plug 14, are soldered to the mutually insulated connecting pads 16a, 16b of the contact area 17. The contact area 17 consists of conductors extending on the surface of a plate section 18.

In front of the plate section 18, the case 10 houses the cylindrical capacitor 19 which is disposed substantially coaxially and almost fills the cross section of the case 10. The leads 20 of the capacitor 19 which are in the form of leg-like members project from the forward end face of the latter. Each of the leads 20 is soldered to a connecting pad 21a and 21b, respectively, of a contact area 22. These connecting pads consist of conductors arranged on the supporting plate 23. The supporting plate 23 is arranged in series with the capacitor 19 and extends diametrically across and within the case so that when viewed in cross-section of the case, the support plate 23 extends essentially over the entire internal width of the case. The supporting plate consists of an epoxy resin, a ceramic material or some other nonconductor. The integrated circuit 24 in the form of a silicon chip is mounted by cementing on the rigid supporting plate 23. The connecting points of the chip are connected with thin wires 26 by bonding to the corresponding conductors 25. Additional conductors, which are likewise in contact with the integrated circuit 24, lead to connecting points 27a, 27b provided at the front end of the supporting plate 23. To these connecting points 27a, 27b, the metal tags or leads of a fusehead 28 are soldered, this fusehead freely projecting past the forward end of the supporting plate into a cavity 29 of the case 10. The priming charge and the base charge 30 are accommodated in the front end of the case 10, this priming charge being ignited upon deflagration of the fusehead 28 and enabling detonation of the base charge and of the surrounding explosive (not illustrated).

In the present embodiment, the plate section 18 is connected to the supporting plate 23 by way of two longitudinally extending paths 31a, 31b, so that the plate section forms an integral part with the supporting plate. Conductors extend along the paths 31a, 31b, connecting the connecting pads 16a, 16b to the integrated circuit 24. The paths 31a, 31b surround a recess 23' wherein the capacitor 19 is arranged. It is alternatively possible to utilize a single path along one side of the capacitor 19 so that the recess 23' is open toward one side. In this case, the conductors connected to the connecting pads 16a, 16b can suitably be located on opposite sides of the single path; in the zone of the supporting plate 23, a through connection extending through the supporting plate must be provided in the zone of the supporting plate 23, in order to be able to connect the conductor located on the underside of the supporting plate to the chip located on the topside.

In another embodiment (not shown), the plate section 18 is completely separated from the supporting plate 23 so that there are no paths 31a, 31b at all. The connecting of the connecting pads 16a, 16b with the corresponding conductors of the supporting plate 23 takes place in this instance via insulated wires extending laterally along the capacitor 19.

A programming area 32, consisting of conductors, is arranged on the supporting plate 23, made up in the present embodiment of six conductive strips 32a–32f joined at one of their ends and connected to earth or ground potential, whereas the other ends are connected by bonding wires 26 to the chip of the integrated circuit 24. Each individual conductive strip 32a through 32f can be severed with a mechanical cutting device or by means of a strongly focused laser beam, so that the connection of the respective connecting point of the electronic circuit to ground potential is eliminated once severing of the conductive strip has been effected.

Figure 4A:
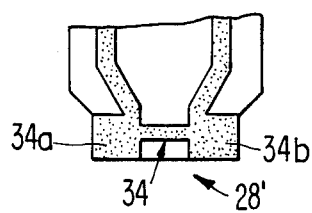
FIG. 4a shows a further alternative embodiment of the fusehead pellet.
Figure 4:
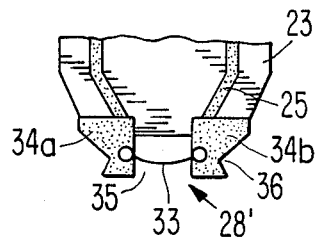
FIG. 4 shows an alternative embodiment of fusehead pellet.

In FIG. 4, the fusehead 28' consists of a bridgewire 33 extending between two connecting points 34a, 34b at the forward end of the supporting plate 23 and bridging a cutout 35 of the supporting plate. The recesses 36 serve as guidance for the bridgewire while the latter is soldered to the connecting points.

In FIG. 4a, the fusehead 28' consists of a metallic film bridge 34 connecting the two points 34a, 34b of the forward end of the supporting plate 23. Instead of the metallic film bridge also a carbon bridge, a spark gap or the like could be used.

Figure 5:
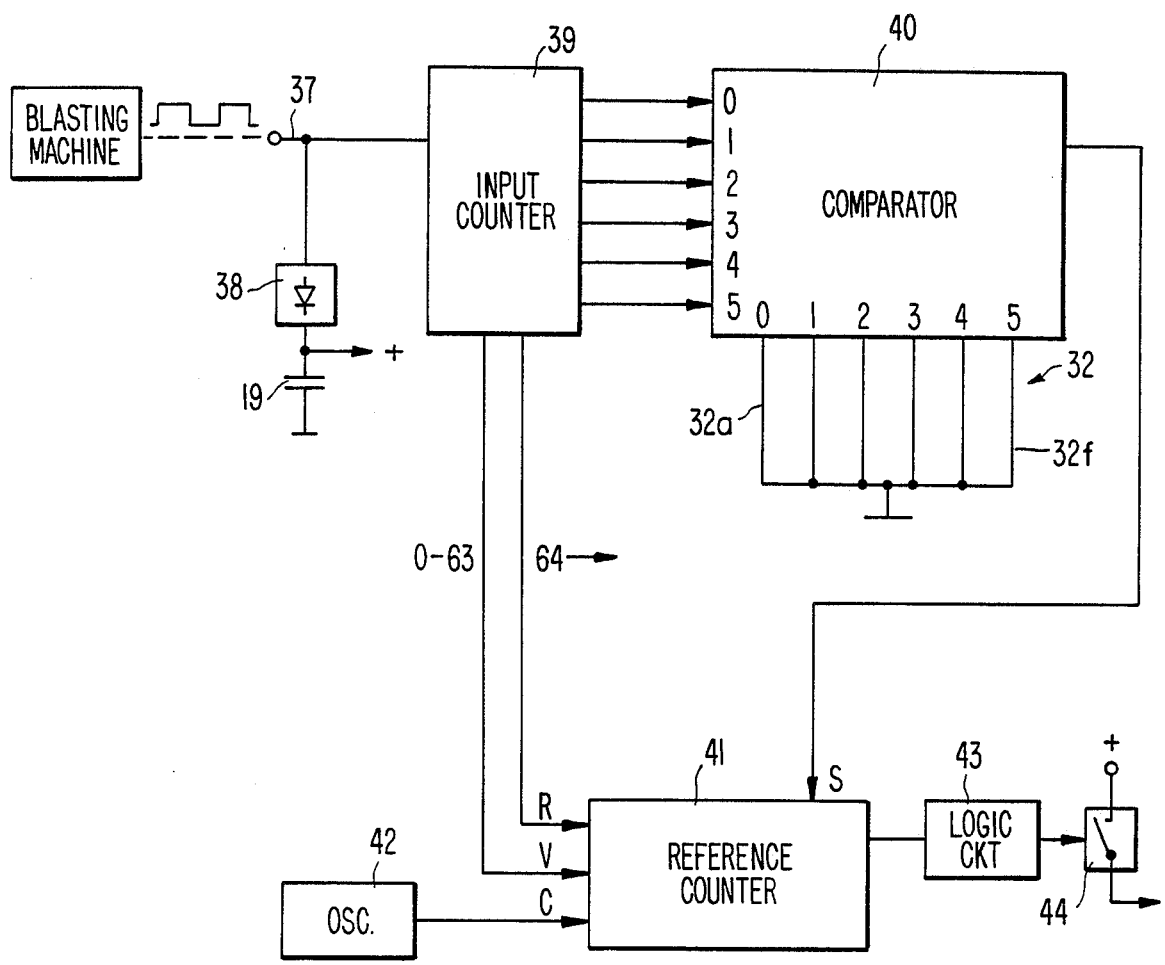
FIG. 5 is a block circuit diagram of the essential components contained in the integrated circuit.

FIG. 5 illustrates in block diagram form the essential components of the integrated circuit 24, together with the capacitor 19 connected to this circuit and the conductive strips 32a to 32f applied to the supporting plate 23.

An input line 37, connected to one of the detonator wires 13, is supplied with pulses from an external blasting machine (not illustrated). These pulses are fed to the capacitor 19 by way of a rectifier arrangement 38, in order to charge the capacitor. The capacitor 19 provides a voltage to supply the remaining components and finally also for the current of the fusehead 28. The pulses from the input line 37 are fed to a six-stage input counter 39 configured as a binary counter and able to count from 0 to 63. The six output lines of the input counter 39 are fed to one of the inputs of an equivalence gate or comparator 40. The other input of the comparator 40, likewise exhibiting six positions, is connected to the six conductive strips 32a through 32f, the other ends of these strips being at ground potential. If ground potential is present at a point of the other input of the capacitor, this represents a logic "0" signal, and if the conductive strip is interrupted, this represents a "1" signal.

The output of the comparator 40 is connected to the stop input of a reference counter 41. This reference counter 41 is configured as a forward-backward counter. It counts the pulses appearing at its counter input C in the forward direction if a forward signal is applied to the forward control input V, and it counts the pulses of the counter input C in the backward or reverse direction if a backward signal is applied to the backward input R. The forward signal is supplied by the input counter 39 as long as the count of the latter is in the range from 0 to 63. The backward counting signal is supplied by the input counter 39 if its count overflows. The counter input C of the reference counter 41 is connected to an oscillator 42. The output of the reference counter 41 is connected, via a logic circuit 43 recognizing the count "0,0,0 . . . 0", to an electronic switch 44 which is closed as soon as the count of reference counter 41 has reached the value 0. In this case where the blasting machine delivers pulses to the input line 37, the input counter 39 is counted up from value 0. In case of coincidence between both inputs of the comparator 40, the comparator transmits a pulse to the stop input S of the reference counter 41. This reference counter counts up the pulses of the oscillator from 0 until appearance of the stop signal and retains the count present upon arrival of the stop signal until a backward signal appears at its input R. This backward signal is transmitted after the count of the input counter has reached the value 64. The reference counter 41 now counts backwards from the count contained therein and, once it has reached the value 0, the electronic switch 44 is closed by way of the logic circuit 43 so that the fusehead is supplied with current and detonation is enabled.

By interruption of one or several conductive strips 32a through 32f, any value between 0 and 63 can be set in the programming area 32. If the conductive strip 32a is severed, the stop signal for the reference counter 41 is generated as early as during the first pulse received by the input counter 39. In contrast thereto, if only the conductive strip 32f is interrupted, then the stop signal is produced as soon as the input counter 39 has received the 32nd pulse. In this way, the count of the reference counter 41 forming the upper limit of charging (of up counting) of the reference counter 41 can be programmed at the programming area 32. This charging of the reference counter represents a measure for the time required for the down counting of the reference counter to zero, i.e., the delay period.

Under practical conditions, numerous delayed-action explosive detonators are connected to a single blasting machine, these detonators being programmed for differing delay periods and all being supplied with the same pulses at their input lines 37. The reference counters of the delayed-action explosive detonators are charged to different levels in correspondence with the individual programming. After the blasting machine has transmitted a specific number of pulses (here: 64 pulses), charging of the reference counters of all delayed-action blasting detonators is terminated, and thereafter follows the down counting operation where the zero levels of the reference counters are then reached at differing points in time.

While we have shown and described various embodiments in accordance with the present invention, it is understood that the same is not limited thereto but is susceptible of numerous changes and modifications as known to those skilled in the art and we therefore do not wish to be limited to the details shown and described herein but intend to cover all such changes and modifications as are encompassed by the scope of the appended claims.

What is claimed is:

1. An electronic delayed-action explosive detonator comprising a tubular case, a capacitor chargeable by pulses from a blasting machine to store a charge sufficient to enable detonation, integrated circuit means separate from the capacitor for processing pulses from the blasting machine to control elapse of a delay time after the delay time has been set so as to enable detonation, primer means to which current is supplied upon elapse of the delay time for enabling detonation, detonator wires extending from the tubular case for enabling connection of the blasting machine to at least one of the capacitor and integrated circuit means, and supporting plate means separate from the capacitor for carrying the integrated circuit means, the supporting plate means being disposed in a series arrangement with the capacitor within the tubular case, the supporting plate means having a first contact area with connecting pad means for enabling attachment of leads of the capacitor, and a second contact area with connecting pad means for enabling attachment of the detonator wires within the tubular case and extending outwardly therefrom.

2. An electronic delayed-action explosive detonator according to claim 1, wherein the supporting plate means is a single plate member.

3. An electronic delayed-action explosive detonator according to claim 1, wherein the supporting plate means comprises at least two plate sections, one plate section carrying the integrated circuit means and having the first contact area thereon and the second plate section having the second contact area thereon.

4. An electronic delayed-action explosive detonator according to claim 1, wherein the capacitor is disposed substantially coaxially with the tubular case and occupies a large portion of the cross-section of the tubular case, and the supporting plate means disposed in the series arrangement behind the capacitor extends, when viewed in cross-section of the tubular case, substantially over the entire internal width of the tubular case.

5. An electronic delayed-action explosive detonator according to claim 1, wherein the supporting plate means includes first and second plate sections, the first plate section carrying the integrated circuit mean and the second plate section having the second contact area thereon, the second plate section being connected to the first plate section by at least one path member extending laterally along the capacitor.

6. An electronic delayed-action explosive detonator according to claim 5 wherein the at least one path portion is provided with at least one conductor, one end of the at least one conductor being contacted to a connecting pad means of the second contact area, and the other end of the at least one conductor being connected to the integrated circuit means.

7. An electronic delayed-action explosive detonator according to claim 1, wherein the supporting plate means includes a first plate section carrying the integrated circuit means, and a second plate section separated from the first plate section and having the second contact area thereon, the connecting pad means of the second contact area being contacted to the integrated circuit means by wires extending laterally along the capacitor.

8. An electronic delayed-action explosive detonator according to claim 1, wherein the supporting plate means carries a programming area formed of a plurality of conductive strips, the programming area being alterable by external means for setting different selectable delay times for the detonator.

9. An electronic delayed-action explosive detonator according to claim 8, wherein the plurality of conductive strips of the programming area are connected to the integrated circuit means so that the delay time is alterable by interruption of at least one of the plurality of conductive strips.

10. An electronic delayed-action explosive detonator according to claim 1, wherein the supporting plate means is provided with conductors on opposite sides of the supporting plate means, the supporting plate means being provided with an opening therethrough in at least one location so as to enable contact from a conductor at one side to a conductor at the opposite side of the supporting plate means.

11. An electronic delayed-action explosive detonator according to claim 1, wherein the primer means includes one of a bridgewire, metallic film bridge and carbon bridge, the ends of the primer mean being directly connected to connecting points of the first plate section.

12. An electronic delayed-action explosive detonator according to claim 4, wherein the supporting plate means includes first and second plate sections, the first plate section carrying the integrated circuit mean and the second plate section having the second contact area thereon, the second plate section being connected to the first plate section by at least one path member extending laterally along the capacitor.

13. An electronic delayed-action explosive detonator according to claim 12, wherein the at least one path portion is provided with at least one conductor, one end of the at least one conductor being contacted to a connecting pad means of the second contact area, and the other end of the at least one conductor being connected to the integrated circuit means.

14. An electronic delayed-action explosive detonator according to claim 4, wherein the supporting plate means includes a first plate section carrying the integrated circuit means, and a second plate section separate from the first plate section and having the second contact area thereon, the connecting pad means of the second contact area being connected to the integrated circuit means by wires extending laterally along the capacitor.

15. An electronic delayed-action explosive detonator according to claim 4, wherein the supporting plate means carries a programming area formed of a plurality of conductive strips, the programming area being alterable by external means for setting different selectable delay times for the detonator.

16. An electronic delayed-action explosive detonator according to claim 15, wherein the plurality of conductive strips of the programming area are connected to the integrated circuit means so that the delay time is alterable by interruption of at least one of the plurality of conductive strips.

17. An electronic delayed-action explosive detonator according to claim 5 wherein the supporting plate means carries a programming area formed of a plurality of conductive strips, the programming area being alterable by external means for setting different selectable delay times for the detonator.

18. An electronic delayed-action explosive detonator according to claim 7, wherein the supporting plate means carries a programming area formed of a plurality of conductive strips, the programming area being alterable by external means for setting different selectable delay times for the detonator.

19. An electronic delayed-action explosive detonator according to claim 18, wherein the plurality of conductive strips of the programming area are connected to the integrated circuit means so that the delay time is alterable by interruption of at least one of the plurality of conductive strips.

20. An electronic delayed-action explosive detonator according to claim 4, wherein the supporting plate means is provided with conductors on opposite sides of the supporting plate means, the supporting plate means being provided with an opening therethrough in at least one location so as to enable contact from a conductor at one side to a conductor at the opposite side of the supporting plate means.

21. An electronic delayed-action explosive detonator according to claim 5, wherein the supporting plate means is provided with conductors on opposite sides of the supporting plate means, the supporting plate means being provided with an opening therethrough in at least one location so as to enable contact from a conductor at one side to a conductor at the opposite side of the supporting plate means.

22. An electronic delayed-action explosive detonator according to claim 7, wherein the supporting plate means is provided with conductors on opposite sides of the supporting plate means, the supporting plate means being provided with an opening therethrough in at least one location so as to enable contact from a conductor at one side to a conductor at the opposite side of the supporting plate means.

23. An electronic delayed-action explosive detonator according to claim 19, wherein the supporting plate means is provided with conductors on opposite sides of the supporting plate means, the supporting plate means being provided with an opening therethrough in at least one location so as to enable contact from a conductor at one side to a conductor at the opposite side of the supporting plate means.

24. An electronic delayed-action explosive detonator according to claim 4, wherein the primer means includes one of a bridgewire, a metallic film bridge and a carbon bridge, the ends of the primer means being directly connected to connecting points of the first plate section.

25. An electronic delayed-action explosive detonator according to claim 5, wherein the primer means includes one of a bridgewire, a metallic film bridge, and a carbon bridge, the ends of the primer means being directly connected to connecting points of the first plate section.

26. An electronic delayed-action explosive detonator according to claim 7, wherein the primer means includes one of a bridgewire, a metallic film bridge, and a carbon bridge, the ends of the primer means being directly connected to connecting points of the plate section.

* * * * *